United States Patent
Hahn et al.

(10) Patent No.: US 7,265,392 B2
(45) Date of Patent: Sep. 4, 2007

(54) LIGHT-EMITTING-DIODE CHIP COMPRISING A SEQUENCE OF GAN-BASED EPITAXIAL LAYERS WHICH EMIT RADIATION AND A METHOD FOR PRODUCING THE SAME

(75) Inventors: Berthold Hahn, Hemau (DE); Ulrich Jacob, Regensburg (DE); Hans-Jürgen Lugauer, Sinzing (DE); Manfred Mundbrod-Vangerow, Oxenbronn (DE)

(73) Assignee: Osram GmbH, Regensburg (DE)

( * ) Notice: Subject to any disclaimer, the term of this patent is extended or adjusted under 35 U.S.C. 154(b) by 0 days.

(21) Appl. No.: 10/296,596

(22) PCT Filed: May 28, 2001

(86) PCT No.: PCT/DE01/02010

§ 371 (c)(1),
(2), (4) Date: Jan. 16, 2003

(87) PCT Pub. No.: WO01/91195

PCT Pub. Date: Nov. 29, 2001

(65) Prior Publication Data

US 2003/0168664 A1 Sep. 11, 2003

(30) Foreign Application Priority Data

May 26, 2000 (DE) ................................ 100 26 254

(51) Int. Cl.
*H01L 33/00* (2006.01)
(52) U.S. Cl. ............................ 257/99; 257/98; 257/103
(58) Field of Classification Search .................. 257/98, 257/99, 103; 438/47
See application file for complete search history.

(56) References Cited

U.S. PATENT DOCUMENTS

| 4,232,440 A | 11/1980 | Bastek |
| 4,243,996 A | 1/1981 | Lebailly et al. |
| 4,983,538 A | 1/1991 | Gotou |
| 5,040,044 A | 8/1991 | Noguchi et al. |

(Continued)

FOREIGN PATENT DOCUMENTS

| CN | 1218997 | 9/2005 |
| DE | 29 15 888 | 10/1979 |
| DE | 40 38 216 | 7/1991 |
| DE | 43 05 296 | 8/1994 |
| DE | 690 08 931 | 12/1994 |
| DE | 197 53 492 | 9/1998 |
| DE | 19830838 | 1/1999 |

(Continued)

OTHER PUBLICATIONS

Lee, J.L. et al., "Ohmic Contact Formation Mechanism of Nonalloyed Pd Contacts to P-type GaN Observed by Position Annihilation Spectroscopy", *Applied Physics Letters*, vol. 74, No. 16, pp. 2289-2291; 1999.

(Continued)

*Primary Examiner*—Jerome Jackson
(74) *Attorney, Agent, or Firm*—Fish & Richardson P.C.

(57) ABSTRACT

A light-emitting diode chip (1) comprises a GaN-based, radiation-emitting epitaxial layer sequence (3), an active region (19), an n-doped layer (4) and a p-doped layer (5). The p-doped layer (5) is provided, on its main surface (9) facing away from the active region (19), with a reflective contact metallization (6) comprising a radioparent contact layer (15) and a reflective layer (16). Methods for fabricating LED chips of this type by thin-film technology are provided, as are LED components containing such LED chips.

17 Claims, 1 Drawing Sheet

U.S. PATENT DOCUMENTS

| | | | |
|---|---|---|---|
| 5,157,468 A | 10/1992 | Matsumoto | |
| 5,210,051 A | 5/1993 | Carter, Jr. | |
| 5,362,667 A | 11/1994 | Linn et al. | |
| 5,373,184 A | 12/1994 | Moslehi | |
| 5,374,564 A | 12/1994 | Bruel | |
| 5,376,580 A | 12/1994 | Kish et al. | |
| 5,429,954 A | 7/1995 | Gerner | |
| 5,625,202 A | 4/1997 | Chai | |
| 5,661,074 A | 8/1997 | Tischler | |
| 5,728,623 A | 3/1998 | Mori | |
| 5,753,134 A | 5/1998 | Biebl | |
| 5,780,873 A | 7/1998 | Itaya et al. | |
| 5,786,606 A | 7/1998 | Nishio et al. | |
| 5,862,167 A | 1/1999 | Sassa et al. | |
| 5,866,468 A | 2/1999 | Kono et al. | |
| 5,874,747 A | 2/1999 | Redwing et al. | |
| 5,877,070 A | 3/1999 | Goesele et al. | |
| 5,880,491 A | 3/1999 | Soref et al. | |
| 5,917,202 A | 6/1999 | Haitz et al. | |
| 5,928,421 A | 7/1999 | Yuri et al. | |
| 6,060,335 A | 5/2000 | Rennie et al. | |
| 6,060,730 A | 5/2000 | Tsutsui | |
| 6,100,104 A | 8/2000 | Haerle | |
| 6,111,272 A | 8/2000 | Heinen | |
| 6,133,589 A | 10/2000 | Krames et al. | |
| 6,222,207 B1 | 4/2001 | Carter-Coman et al. | |
| 6,258,618 B1 | 7/2001 | Lester | |
| 6,291,839 B1 * | 9/2001 | Lester | 257/91 |
| 6,328,796 B1 | 12/2001 | Kub et al. | |
| 6,335,212 B1 | 1/2002 | Uemura et al. | |
| 6,347,101 B1 | 2/2002 | Wu et al. | |
| 6,365,427 B1 | 4/2002 | Gauggel et al. | |
| 6,420,242 B1 | 7/2002 | Cheung et al. | |
| 6,448,102 B1 | 9/2002 | Kneissl et al. | |
| 6,468,824 B2 | 10/2002 | Chen et al. | |
| 6,495,862 B1 * | 12/2002 | Okazaki et al. | 257/103 |
| 6,518,079 B2 | 2/2003 | Imler | |
| 6,562,701 B2 | 5/2003 | Ishida et al. | |
| 6,607,931 B2 | 8/2003 | Streubel | |
| 6,617,182 B2 | 9/2003 | Ishida et al. | |
| 6,617,261 B2 | 9/2003 | Wong et al. | |
| 6,620,643 B1 | 9/2003 | Koike | |
| 6,677,173 B2 | 1/2004 | Ota | |
| 6,849,878 B2 | 2/2005 | Bader et al. | |
| 6,869,820 B2 | 3/2005 | Chen | |
| 6,878,563 B2 | 4/2005 | Bader et al. | |
| 6,946,312 B2 | 9/2005 | Kon et al. | |
| 6,975,444 B2 | 12/2005 | Huibers | |
| 2001/0042866 A1 | 11/2001 | Conan et al. | |
| 2002/0096102 A1 | 7/2002 | Sloot | |
| 2003/0086856 A1 | 5/2003 | D'Evelyn et al. | |
| 2003/0131788 A1 | 7/2003 | Ueda | |
| 2003/0168664 A1 | 9/2003 | Hahn et al. | |
| 2003/0197170 A1 | 10/2003 | Bader et al. | |
| 2004/0026709 A1 | 2/2004 | Bader et al. | |
| 2004/0033638 A1 | 2/2004 | Bader et al. | |
| 2004/0222434 A1 | 11/2004 | Uemura et al. | |
| 2005/0282373 A1 | 12/2005 | Bader et al. | |
| 2006/0011925 A1 | 1/2006 | Bader et al. | |

FOREIGN PATENT DOCUMENTS

| | | |
|---|---|---|
| DE | 197 41 442 | 4/1999 |
| DE | 19921987 | 11/1999 |
| DE | 198 38 810 | 3/2000 |
| DE | 10000088 | 8/2000 |
| EP | 0 051 172 | 5/1982 |
| EP | 06-045651 | 2/1994 |
| EP | 0 404 565 | 5/1994 |
| EP | 0 282 075 | 2/1995 |
| EP | 0 356 037 | 6/1995 |
| EP | 0 317 445 | 5/1996 |
| EP | 0 810 674 | 12/1997 |
| EP | 0 817 283 | 1/1998 |
| EP | 10-150220 | 6/1998 |
| EP | 0 871 228 | 10/1998 |
| EP | 0 740 376 | 2/1999 |
| EP | 0 896 405 | 2/1999 |
| EP | 0 905 797 | 3/1999 |
| EP | 11-191641 | 7/1999 |
| EP | 11-220168 | 8/1999 |
| GB | 2 322 737 | 9/1998 |
| GB | 2 346 478 | 8/2000 |
| JP | 04223330 | 8/1992 |
| JP | 06-45651 | 2/1994 |
| JP | 07221347 | 8/1995 |
| JP | 08032116 | 2/1996 |
| JP | 08064910 | 3/1996 |
| JP | 08116090 | 5/1996 |
| JP | 10209494 | 8/1998 |
| JP | 10223496 | 8/1998 |
| JP | 10290027 | 10/1998 |
| JP | 11-074558 | 3/1999 |
| JP | 11068157 | 3/1999 |
| JP | 11150297 | 6/1999 |
| JP | 11-220171 | 8/1999 |
| JP | 11-251634 | 9/1999 |
| JP | 2000077713 | 3/2000 |
| TW | 369731 | 9/1999 |
| TW | 441859 | 4/2000 |
| WO | WO 92/13363 | 8/1992 |
| WO | WO95/00974 | 1/1995 |
| WO | WO 97/48138 | 12/1997 |
| WO | WO 00/19499 | 4/2000 |
| WO | WO 01/41223 | 6/2001 |
| WO | WO 01/47038 | 6/2001 |
| WO | WO 01/47039 | 6/2001 |

OTHER PUBLICATIONS

Margalith, T. et al., "Indium Tin Oxide Contacts to Gallium Nitride Optoelectronic Devices", *Applied Physics Letters,* vol. 74, No. 26, pp. 3930-3932; 1999.

Mensz, P.M. et al. "$In_xGa_{1-x}N/Al_yN$ Violet Light Emitting Diodes with Reflective P-Contacts for High Single Sided Light Extraction", *Electronics Letters,* vol. 33, No. 24, pp. 2066-2068; 1997; XP-000734311.

I. Schnitzer et al., "30% external quantum efficiency from surface textured, thin-film light-emitting diodes", *Appl. Phy. Lett.,* vol. 63, No. 16, pp. 2174-2176 (Oct. 18, 1993).

A.J. Steckl et al., "Growth and Characterization of GaN Thin Films on SIC SOI Substrates", *Journal of Electronics Materials,* vol. 26, No. 3, pp. 217-223 (1997).

Manfred von Ardenne, "Tabellen zur angewandten Physik", *III, Band,* VEB Deutscher Verlag der Wissenschaften, Berlin 1973, pp. 168-169.

W.S. Wong et al., "Fabrication of thin-film InGaN light-emitting membranes by laser lift-off", *Appl. Phys. Lett.,* vol. 75, No. 10, pp. 1360-1362 (Sep. 6, 1999).

* cited by examiner

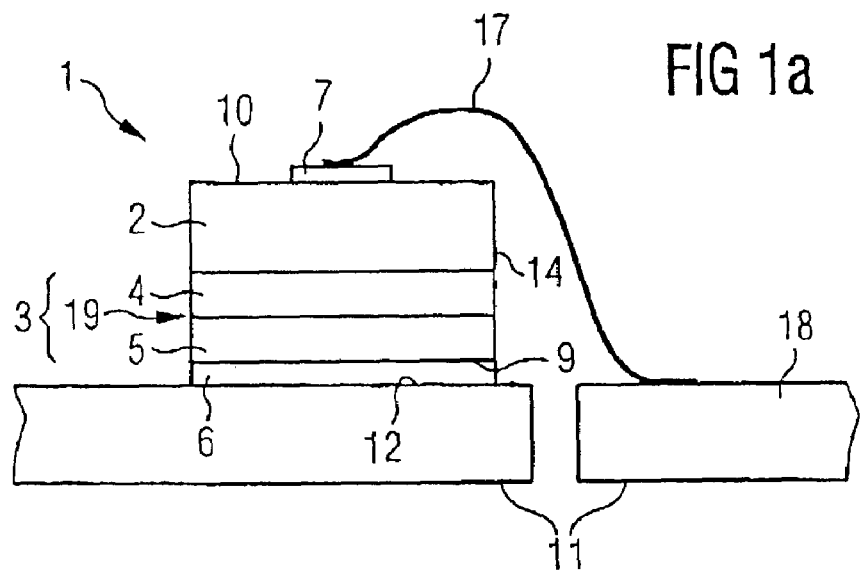
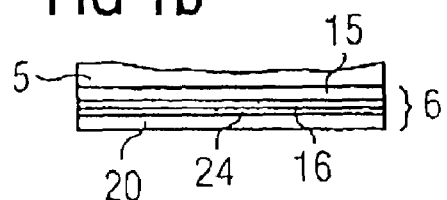
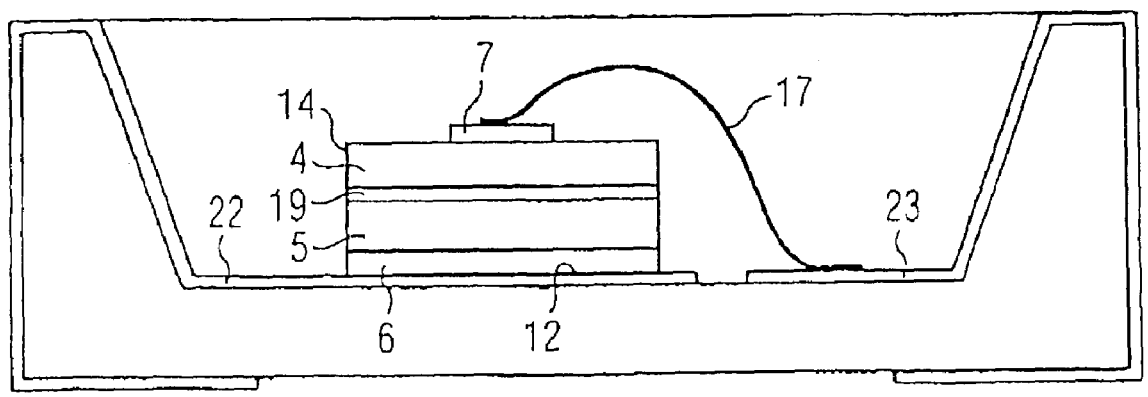

LIGHT-EMITTING-DIODE CHIP COMPRISING A SEQUENCE OF GAN-BASED EPITAXIAL LAYERS WHICH EMIT RADIATION AND A METHOD FOR PRODUCING THE SAME

FIELD OF THE INVENTION

The invention relates to a light-emitting diode chip comprising a GaN-based, radiation-emitting epitaxial layer sequence, to a method for fabricating the same, and to a light-emitting diode component comprising a light-emitting diode chip of this type.

BACKGROUND OF THE INVENTION

The term "GaN-based" as used herein encompasses in particular all ternary and quaternary GaN-based mixed crystals, such as AlN, InN, AlGaN, InGaN, InAlN and AlInGaN and gallium nitride itself.

A fundamental problem in the fabrication of GaN-based light-emitting diode (LED) chips is that the maximum attainable electrical conductivity of p-doped layers, especially p-doped GaN or AlGaN layers, is not sufficient to achieve current spread over the entire lateral cross section of the chip with conventional front contact metallization, as known from LED chips made of other material systems (to maximize radiation decoupling, this type of metallization covers only a fraction of the front face).

Growing the p-type layer on an electrically conductive substrate, which would make it possible to impress a current over the entire lateral cross section of the p-type layer, does not yield an economically viable result. The reasons for this are as follows. First, the fabrication of electrically conductive, lattice-matched substrates (e.g. GaN substrates) for growing GaN-based layers is technically onerous; second, the growth of p-doped GaN-based layers on non-lattice-matched substrates suitable for undoped and n-doped GaN compounds does not yield adequate crystal quality for an LED.

In a known approach designed to combat the above problem, to effect current spread, either a contact layer permeable to the radiation or an additional layer of good electrical conductivity is deposited with substantially full areal coverage on the side of the p-type layer facing away from the substrate, and is provided with a bonding contact.

However, the first-cited proposal has the disadvantage that a substantial portion of the radiation is absorbed in the contact layer. The second proposal requires an additional process step that greatly increases production expenditure.

BRIEF SUMMARY OF THE INVENTION

The object of the invention is, first, to develop an LED chip of the type cited at the beginning hereof that offers improved current spread and whose additional production expenditure is kept to a minimum. An LED component with improved heat dissipation from the active region is also to be provided.

In an LED according to the invention, the p-doped layer is provided on its main surface facing away from the active layer with a reflective contact metallization. A suitable reflective metal layer is, for example, an Ag-based metal layer. The term "Ag-based" includes all metals whose electrical and optical properties are determined substantially by Ag. They are in particular those comprising Ag as their major constituent.

On the one hand, the contact metallization advantageously produces good ohmic contact with very low electrical transition resistance to the epitaxial layer sequence. On the other hand, it advantageously exhibits high reflectivity and very low absorption within the stated spectral range. This results in high back-reflection of the incident electromagnetic radiation into the chip. This back-reflected radiation can then be coupled out of the chip through its bare sides.

In a preferred embodiment, the reflective contact metallization is composed, at least in part, of a PtAg and/or PdAg alloy.

The reflective contact metallization preferably covers more than 50%, especially preferably 100%, of the main surface of the p-doped layer facing away from the active layer. This results in current supply to the entire lateral cross section of the active region.

To promote the adhesion of the reflective contact metallization to the p-doped layer, preferably provided therebetween is a radioparent contact layer substantially comprising at least one metal from the group Pt, Pd, Cr.

As a result, the reflective contact metallization can easily be optimized with respect to both its electrical and its reflective properties.

The thickness of a contact layer of the above-cited type is advantageously 10 nm or less. The optical losses in this layer can thereby advantageously be kept especially low.

Especially preferably, the contact layer has a non-closed, particularly island-like and/or net-like structure. This advantageously enables the Ag-based reflective layer to be in direct contact, at least in part, with the p-doped layer, which arrangement has a positive effect on the electrical and optical properties.

In another advantageous embodiment, the contact layer is substantially composed of indium tin oxide (ITO) and/or ZnO and preferably has a thickness $\geq 10$ nm. Very good current spread accompanied by very low radiation absorption can be achieved with this type of contact layer.

It is further preferred that disposed on the reflective layer is a bondable layer, in particular substantially composed of a diffusion barrier of Ti/Pt or TiWN and of Au or Al, thus improving the bondability of the reflective contact metallization.

In a further LED chip according to the invention, the chip comprises solely epitaxial layers whose total cumulative thickness is 30 μm or less. To this end, a growth substrate is removed following the epitaxial growth of the epitaxial layer sequence. The reflective contact metallization is deposited, with substantially full areal coverage, on the main surface of the p-doped epitaxial layer facing away from the n-doped epitaxial layer. The main surface of the n-doped epitaxial layer facing away from the p-doped epitaxial layer is provided with an n-contact metallization that covers only a portion of this main surface. The decoupling of light from the chip takes place through the bare region of the main surface of the n-type epitaxial layer and through the sides of the chip.

The growth substrate in this type of LED chip can be both electrically insulating and radiopaque, and therefore can advantageously be selected solely with a view toward ideal growth conditions. The particular advantage of a so-called thin-film LED chip of this kind is that there are no light losses from a substrate and radiation decoupling is improved.

A further advantage associated with the LED chip according to the invention is that the radiation-emitting active region, in which the majority of the electrical energy conducted into the chip is converted to heat energy during operation, can be disposed very close to a heat sink, and the epitaxial layer sequence can thus be thermally connected to a heat sink with practically no intermediary, only the p-doped epitaxial layer being located between them. The chip can thus be cooled very effectively, thereby increasing the stability of the wavelength of the emitted radiation. Flow voltage is advantageously reduced in the LED chip according to the invention, owing to the full-area contacting.

In the LED component according to the invention comprising an LED chip according to the invention, the chip is mounted so that its p-side, i.e., its reflective contact metallization, rests on a chip mounting surface of an LED package, particularly a leadframe or a track of an LED package.

Further advantageous embodiments of the invention will become apparent hereinbelow in connection with the exemplary embodiments described in FIGS. 1a to 2.

BRIEF DESCRIPTION OF THE DRAWINGS

FIG. 1a is a schematic representation of a section through a first exemplary embodiment;

FIG. 1b is a schematic representation of a preferred reflective contact metallization;

FIG. 2 is a schematic representation of a section through a second exemplary embodiment.

Like or like-acting elements have been given the same reference numerals in the figures illustrating the different exemplary embodiments.

DETAILED DESCRIPTION OF THE INVENTION

In the LED chip 1 of FIG. 1a, deposited on an SiC substrate 2 is a radiation-emitting epitaxial layer sequence 3. The latter is composed of an n-type doped GaN or AlGaN epitaxial layer 4 and a p-type doped GaN or AlGaN epitaxial layer 5. There can equally well be provided, for example, a GaN-based epitaxial layer sequence 3 having a double heterostructure, a single quantum well (SQW) structure or a multi-quantum well (MQW) structure comprising one or more undoped layer(s) 19, for example of InGaN or InGaAlN.

The SiC substrate 2 is electrically conductive and is transparent to the radiation emitted by an active region 19 of the epitaxial layer sequence 3.

Deposited with substantially full area coverage on epitaxial layer sequence 3, on its p-side 9 facing away from SiC substrate 2, is a reflective, bondable, Ag-based contact metallization 6. This is, for example, composed substantially of Ag, a PtAg alloy and/or a PdAg alloy.

As shown schematically in FIG. 1b, however, the contact metallization 6 can also be composed of a radioparent first layer 15 (starting from epitaxial layer sequence 3) and a reflective second layer 16.

The first layer 15 is, for example, composed substantially of Pt, Pd and/or Cr and has a thickness of 10 nm or less to keep radiation absorption to a minimum. Alternatively, it can be made of indium tin oxide and/or ZnO. In this case its thickness is preferably 10 nm or more, since these materials exhibit very little radiation absorption. The greater thickness is advantageous for current spread.

The second layer 16 is, for example, composed substantially of Ag, a PtAg alloy and/or a PdAg alloy.

To improve bondability, an additional metal layer 20 is deposited on the Ag-based layer. This additional layer is composed of Au or Al, for example. A layer of Ti/Pt or TiWN can be provided as a diffusion barrier 24 between the second layer 16 and the additional metal layer 20.

The SiC substrate 2 is provided on its main surface 10 facing away from epitaxial layer sequence 3 with a contact metallization 7 that covers only a portion of this main surface 10 and is realized as a bond pad for wire bonding. The contact metallization 7 is, for example, composed of an Ni layer deposited on the SiC substrate 2, followed by an Au layer.

The chip 1 is mounted by die bonding with its p-side, i.e., with the reflective contact metallization 6, on a chip mounting surface 12 of a leadframe 11 of an LED package. The n-contact metallization 7 is connected via a bonding wire 17 to a connecting part 18 of the leadframe 11.

The decoupling of light from the chip 1 takes place through the bare region of the main surface 10 of the SiC substrate 2 and through the sides 14 of the chip.

The chip 1 optionally comprises an SiC substrate 2 that is thinned after the growth of the epitaxial layer sequence 3 in order to optimize the thickness of the substrate 2 with regard to the absorption and decoupling of radiation.

The exemplary embodiment shown in FIG. 2 differs from that of FIG. 1a, on the one hand, by the fact that the chip 1 comprises solely epitaxial layers, i.e., epitaxial layer sequence 3 and no substrate layer. The latter was removed, for example by etching and/or grinding, after the growth of the epitaxial layers. The chip height is about 25 μm.

The advantages of a so-called thin-film LED chip of this type are recited in the general part of the description. On the other hand, the epitaxial layer sequence 3 has a double heterostructure, a single quantum well (SQW) structure or a multi-quantum well (MQW) structure comprising one or more undoped layer(s) 19, for example of InGaN or InGaAlN.

The chip 1 is mounted by die bonding with its p-side, i.e., with the reflective contact metallization 6, on a chip mounting surface 12 of a track 22 of an LED package 21. The n-contact metallization 7 is connected via a bonding wire 17 to a further track 23.

Naturally, the description of the invention with reference to the above exemplary embodiments is not to be construed as limiting it thereto. On the contrary, the invention can be used in connection with all LED chips in which the epitaxial layer, remote from a growth substrate, has insufficient electrical conductivity.

What is claimed is:

1. A light-emitting diode chip comprising
   a GaN-based, radiation-emitting epitaxial layer sequence comprising an active region, an n-doped layer and a p-doped layer, and
   a reflective contact metallization assigned to said p-doped layer and comprising:
   a radiation permeable contact layer and a reflective layer, and
      in which said radiation permeable contact layer is arranged between said p-doped layer and said reflective layer,
      wherein said contact layer is a non-closed layer particularly having an island-like or a net-like structure or a combination thereof, and
   wherein said reflective layer covers more than 50% of the main surface of said p-doped layer facing away from said active region.

2. The light-emitting diode chip as recited in claim 1, wherein said contact layer comprises at least one of the metals Pt, Pd and Cr, is composed of one of said metals, or is composed of an alloy of at least two of said metals.

3. The light-emitting diode chip as recited in claim 1, wherein the thickness of said contact layer is 10 nm or less.

4. The light-emitting diode chip as recited in claim 1, wherein said contact layer substantially comprises at least one material from the group of materials including indium tin oxide (ITO) and ZnO.

5. The light-emitting diode chip as recited in claim 4, wherein the thickness of said contact layer is 10 nm or more.

6. The light-emitting diode chip as recited in claim 1, wherein said reflective layer contains Ag.

7. The light-emitting diode chip as recited in claim 6, wherein said reflective layer is composed at least in part of a material from the group of materials including PtAg alloy and PdAg alloy.

8. The light-emitting diode chip as recited in claim 1, wherein said reflective layer covers the entire main surface of said p-doped layer facing away from said active region.

9. The light-emitting diode chip as recited in claim 1, wherein said reflective contact metallization comprises, on its side facing away from said radiation-emitting epitaxial layer sequence, an additional metal layer particularly comprising substantially Au or Al.

10. The light-emitting diode chip as recited in claim 1, wherein an n-doped layer is provided on its main surface facing away from a p-type layer with an n-contact layer that covers only a portion of said main surface, and wherein the decoupling of light from said chip takes place through the bare region of said main surface of said n-type layer and through the sides of the chip.

11. The light-emitting diode chip as recited in claim 1, wherein said chip comprises solely an epitaxial layer sequence with a reflective contact metallization and an additional contact metallization.

12. The light-emitting diode chip as recited in claim 11, wherein the thickness of said epitaxial layer sequence is 30 μm or less.

13. A light-emitting diode component comprising a light-emitting diode chip as recited in claim 1, wherein said epitaxial layer sequence is connected in a thermally conductive manner to a heat sink via said reflective contact metallization.

14. The light-emitting diode component comprising a light-emitting diode chip as recited in claim 1, said chip being mounted on a heat-conducting chip-mounting area of an LED package, particularly on a leadframe or a track of said LED package, wherein said reflective contact metallization is disposed on said chip-mounting area.

15. A method for fabricating a light-emitting diode chip as recited in claim 1, wherein:
  (a) said epitaxial layer sequence is grown on a growth substrate so that said p-doped layer faces away from said growth substrate,
  (b) said reflective contact metallization is deposited on said p-doped layer, and
  (c) said growth substrate is thinned.

16. The method for fabricating a light-emitting diode chip as recited in claim 11, wherein:
  (a) said epitaxial layer sequence is grown on said growth substrate so that said p-doped layer faces away from said growth substrate,
  (b) said reflective contact metallization is deposited on said p-doped layer, and
  (c) said growth substrate is removed.

17. The light-emitting diode chip as recited in claim 1, wherein the contact layer enables the reflective layer to be in direct contact, at least in part, with the p-doped layer.

\* \* \* \* \*

UNITED STATES PATENT AND TRADEMARK OFFICE
CERTIFICATE OF CORRECTION

PATENT NO. : 7,265,392 B2  Page 1 of 1
APPLICATION NO. : 10/296596
DATED : September 4, 2007
INVENTOR(S) : Berthold Hahn et al.

It is certified that error appears in the above-identified patent and that said Letters Patent is hereby corrected as shown below:

Title Page 2 item 56
Column 2, Foreign Patent Documents, please replace:
"EP  06-045651  2/1994" with --JP  06-045651  2/1994--
"EP  10-150220  6/1998" with --JP  10-150220  6/1998--
"EP  11-191641  7/1999" with --JP  11-191641  7/1999--
"EP  11-220168  8/1999" with --JP  11-220168  8/1999--

Signed and Sealed this

Twenty-ninth Day of July, 2008

JON W. DUDAS
*Director of the United States Patent and Trademark Office*